United States Patent [19]

Satoh et al.

[11] Patent Number: 4,987,326

[45] Date of Patent: Jan. 22, 1991

[54] SEMICONDUCTOR INTEGRATED CIRCUIT DEVICE HAVING AN IMPROVED COMMON WIRING ARRANGEMENT

[75] Inventors: Yasuo Satoh, Ohme; Tohru Kobayashi, Iruma, both of Japan

[73] Assignee: Hitachi, Ltd., Tokyo, Japan

[21] Appl. No.: 344,669

[22] Filed: Apr. 28, 1989

[30] Foreign Application Priority Data

Apr. 30, 1988 [JP] Japan ............... 63-107818

[51] Int. Cl.$^5$ ..................... H03K 19/177
[52] U.S. Cl. ............... 307/465; 307/455; 307/467; 357/45
[58] Field of Search ........... 307/443, 455, 465–467, 307/303.1; 364/491; 357/45

[56] References Cited

U.S. PATENT DOCUMENTS

| | | | |
|---|---|---|---|
| 4,207,556 | 6/1980 | Sugiyama et al. | 307/467 X |
| 4,255,672 | 3/1981 | Ohno et al. | 307/467 |
| 4,564,773 | 1/1986 | Tanizawa et al. | 364/491 X |
| 4,577,276 | 3/1986 | Dunlop et al. | 364/491 |
| 4,748,488 | 5/1988 | Suzuki et al. | 307/467 X |
| 4,751,406 | 6/1988 | Wilson | 307/455 |
| 4,804,861 | 2/1989 | Hollstein et al. | 307/455 |
| 4,849,659 | 7/1989 | West | 307/455 |

Primary Examiner—David Hudspeth
Attorney, Agent, or Firm—Antonelli, Terry, Stout & Kraus

[57] ABSTRACT

In a gate array integrated circuit including a plurality of logic gate circuits having a wired-OR form, or the like, a first common combined wiring is provided for connecting the output side in such a manner that the output terminal of each logic gate circuit and a branch node corresponding thereto are in the proximity of one another. A terminal resistor is interposed between a first end of the first common combined wiring and a power source voltage or ground potential of the circuit, and the second end of the first common combined wiring is coupled to a second common combined wiring connecting the input terminals of the logic gate circuits on the input side.

4 Claims, 9 Drawing Sheets

SOURCE GATES    DUMMY GATE    SINK GATES

SEMICONDUCTOR INTEGRATED CIRCUIT DEVICE HAVING AN IMPROVED COMMON WIRING ARRANGEMENT

BACKGROUND OF THE INVENTION

This invention relates to a semiconductor integrated circuit device, and more particularly to a technique effective for use in layout design of a high speed digital processor constituted by a gate array integrated circuit using an ECL (Emitter Coupled Logic) circuit as a basic structural constituent, for example.

ECL circuit consisting of bipolar transistors are now available, as are gate array integrated circuit using such ECL circuit as their basic structural constituent. Furthermore, a high speed digital processor consisting of such a gate array integrated circuit is available.

In the high speed digital processor or the like of the kind described above, a wired-OR system is known as one of the means for reducing the number of circuit devices by simplifying the circuit construction, and DA (Design Automation) technique is known as one of the means for designing automatically and efficiently the circuit devices and wiring layout of the high speed digital processor or the like.

The DA technique is described, for example, in IEEE Proceedings of the 23rd Design Automation Conference, pp. 404-410 in the June issue for 1986.

FIG. 4 of the accompanying drawings shows an example of the arrangement of a high speed digital processor consisting of the gate array integrated circuit described above. The gate array integrated circuit constituting the high speed digital processor includes ECL gate cells G11~G18 and G61~G68 that the arranged in matrix. Among them, the gate cells G25, G31 and G44 include open-emitter type output transistors and their output terminals are connected commonly to form wired-OR. The output signals of these gate cells are supplied to the input terminals of the gate cells G13, G52 and G58.

When the layout of the high speed digital processor such as described above is made automatically by the DA technique, grouping and improvement in the arrangement are carried out so that the gate cells G25, G31 and G44 on the output side are arranged relatively close to one another, and a terminal resistor RE is disposed at the gate cell G44 disposed substantially at the center to form wired-OR. In this manner the wiring distance from the gate cells G25 and G31 to the terminal resistor RE is reduced and the level drop of the output signal due to the distributed resistance of these combined wiring is restricted within a predetermined range.

However, as the scale of the integrated circuit and the size of a substrate have become greater and greater with the development in the miniaturization technique of the integrated circuit, the inventor of the present invention has found that the following problems develop in the layout design described above. Namely, the distribution resistance value per unit length of the combined wiring increases with miniaturization of the combined wiring and the level drop of the output signal between the gate cell G31 and a branch node nh, for example, becomes greater and invites an erroneous operation of the input gate cell G13, or the like. Therefore, the limitation to the wiring length unavoidably must be made more severe. However, there are many cases where the requirement described above cannot be satisfied because the layout zone of the devices is enlarged with the increase in the number of the devices to be mounted and in the size of the substrate, on the contrary. In such a case, manual correction must be made. Accordingly, the effects of the DA technique cannot be fully exhibited. As the limitation to wirings and the like becomes more severe, freedom of the device layout is limited, on the contrary, and efficient layout design cannot be made.

SUMMARY OF THE INVENTION

It is an object of the present invention to provide an efficient layout method which mitigates the limitation imposed on the layout of a logic gate circuit having the wired-OR form and combined wiring.

It is another object of the present invention to expand layout freedom of a high speed digital processor the like containing a logic gate circuit having a wired-OR form, and to make its layout design more efficient.

The above and other objects and novel features of the present invention will become more apparent from the following description when taken in conjunction with the accompanying drawings.

Among the inventions disclosed herein, the following will illustrate a typical example. In a gate array integrated circuit or the like containing a plurality of logic gate circuits having a wired-OR form, a first common combined wiring for combining the output terminals of the logic gate circuits on the output side are arranged at one stroke in such a manner that branch nodes corresponding to the output terminal of each logic gate circuit are adjacent to one another. In other words, the common combined wirings are arranged serially so that the combined wiring of the common combined wiring and the output terminal of each logic gate circuit is below a predetermined length. A terminal resistor is disposed between one of the ends of the serial common combined wiring and the power source voltage or ground potential of the circuit, and the other end is coupled to the second common combined wiring to which the input terminal of the logic gate circuit on the input side is connected.

According to the means described above, the distributed resistance of the first common combined wiring can be contained in the substantial distributed resistance viewed from the logic gate circuit on the input side so that the limitation imposed on the combined wiring of the logic gate circuit in the wired-OR form can be mitigated. In this manner the layout freedom of a high speed digital processor or the like containing a plurality of logic gate circuits in the wired-OR form can be expanded and its layout design can be made highly efficient.

DESCRIPTION OF THE PREFERRED EMBODIMENTS

Figure 1:
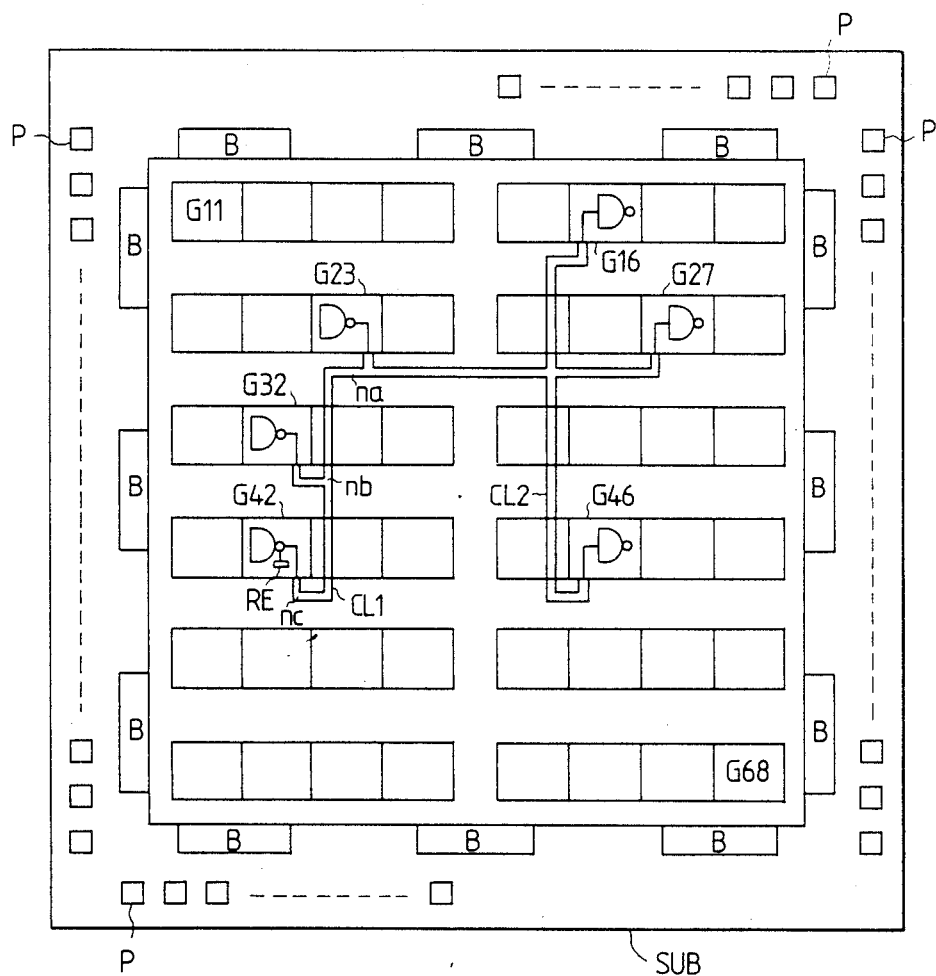
FIG. 1 is an arrangement diagram showing an embodiment of a high speed digital processor to which the present invention is applied.

FIG. 1 is an arrangement diagram showing an embodiment of a high speed digital processor to which the present invention is applied. The high speed digital processor of which embodiment is preferably formed by changing optionally part of the mask of a gate array integrated circuit using an ECL circuit as its basic structure in accordance with a user's specification. Each circuit device of the gate array integrated circuit can be formed on one semiconductor substrate such as a single crystal silicon substrate in accordance with a known fabrication technique of semiconductor integrated circuits.

In this embodiment, layout of the logic gate circuits constituting the high speed digital processor and combined wirings disposed between these logic gate circuits is made automatically and efficiently by use of the DA technique using a computer. The high speed digital processor includes a plurality of logic gate circuits having a wired-OR form and terminal resistors. The layout limitation to these logic gate circuits and terminal resistors and their combined wirings can be mitigated because the present invention is applied as will be described later. As a result, layout freedom of the high speed digital processor is expanded and its layout design can be made efficient.

The high speed digital processor shown in FIG. 1 includes gate cells G11~G18 and G61~G68 disposed in matrix on a semiconductor substrate SUB. Nine buffer cells B are disposed around these gate cells. A large number of bonding pads P are disposed linearly at the peripheral portions of the semiconductor substrate SUB.

The high speed digital processor includes three gate cells G23, G32 and G42 (a first logic gate circuit group) whose output terminals are coupled commonly and three gate cells G16, G27 and G46 (a second logic gate circuit group) whose input terminals are coupled to the output terminals of the gate cells described above. As will be described later, these logic gate circuits all have fundamentally the same circuit construction, and the output made selectively to an open-emitter form as a load resistor forming an output emitter follower circuit is omitted selectively.

In this embodiment, the gate cells G23, G32 and G42 constituting the first logic gate circuit group are disposed relatively adjacent to one another on the left side of the semiconductor substrate SUB. The output terminals of these gate cells are connected commonly by a first common combined wiring CL1 which is disposed between the output terminal of the gate cell G23, that is, a branch node na, and the output terminal of the gate cell G42, that is, a branch node nc. A load resistor disposed in the output emitter follower circuit of the gate cell G42 is connected to one of the ends of this first common combined wiring, that is, to the node nc, as a terminal resistor RE constituting wired-OR.

On the other hand, the gate cells G16, G27 and G46 constituting the second logic gate circuit group are disposed similarly on the right side of the substrate SUB close to one another. The input terminals of these gate cells are connected commonly through the second common combined wiring CL2 and then connected to the other end of the common combined wiring CL1, that is, to the branch node na.

Figure 2:
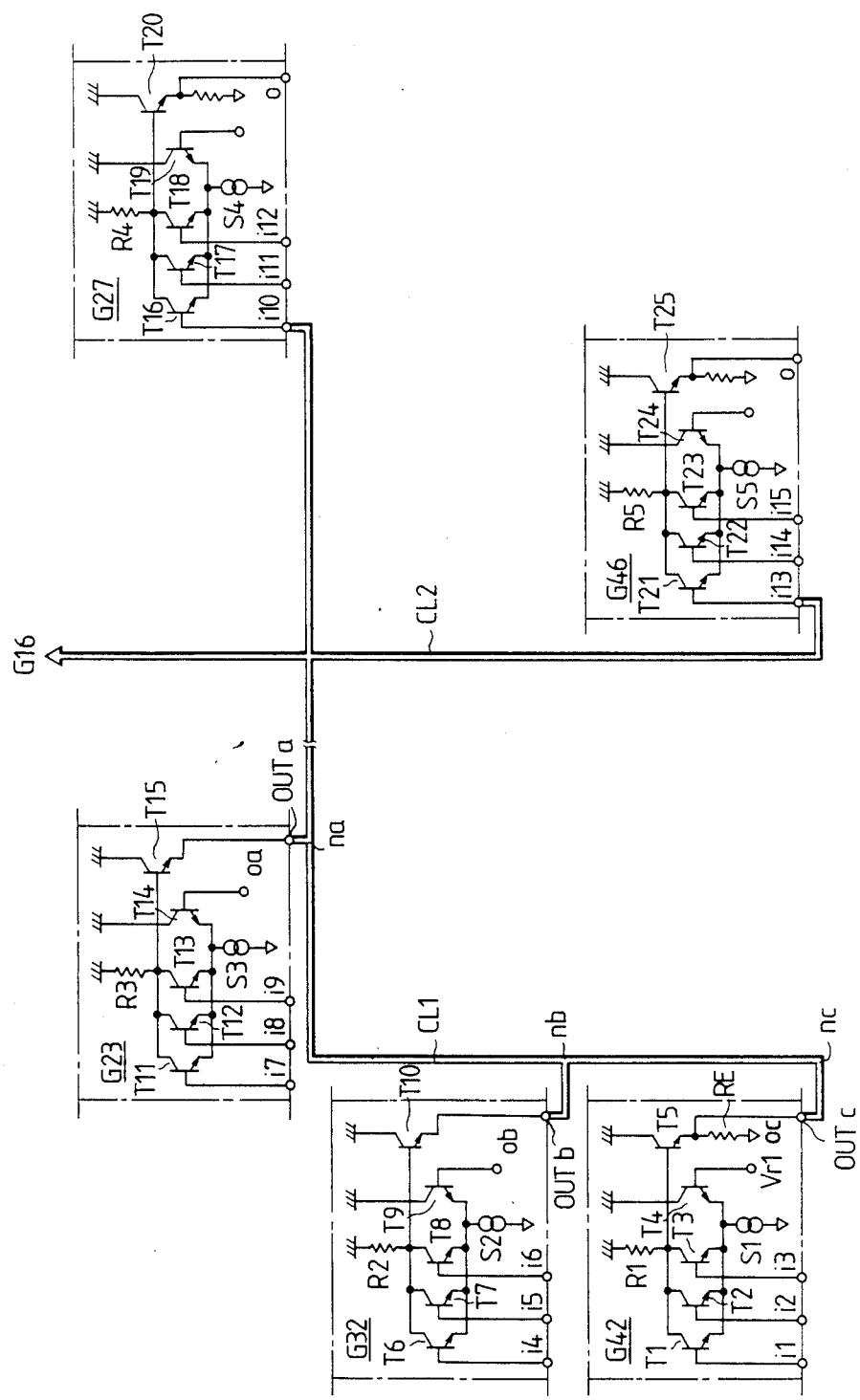
FIG. 2 is a partial circuit diagram showing an embodiment of the high speed digital processor of FIG. 1.

FIG. 2 shows a circuit diagram of an embodiment of the high speed digital processor of FIG. 1. This drawing shows typically the gate cells G23, G27, G42 and G46 constituting the high speed digital processor. The other gate cells have all the same circuit construction with the exception of the presence or absence of the load resistor of the output emitter follower circuit, that is, the terminal resistor RE. The buffer cell B and the bonding pad P will not be explained because they are not directly relevant to the gist of the invention. Incidentally, the bipolar transistors shown in FIG. 2 are all of the NPN type.

In FIG. 2, each gate cell constituting the high speed digital processor includes three transistors $T1 \sim T3$ whose collectors and emitters are commonly connected in the parallel form, as typified by the gate cell G42, though the circuit arrangement is not particularly limitative. A load resistor R1 is disposed between the collectors of these transistors connected commonly and the ground potential of the circuit. The commonly connected emitters of these transistors are connected commonly to the emitter of a transistor T4 in a differential form and further to a power source voltage of the circuit through a constant current source S1. The collector of the transistor T4 is connected to the ground potential of the circuit and a predetermined reference potential Vr1 is supplied to its base from a constant voltage generation circuit of the high speed digital processor not shown in the drawing. First, second and third input signals $i1 \sim i3$ are supplied to the base of the transistors $T1 \sim T3$, respectively, and corresponding input signals are supplied thereto from other gate cells of the high speed digital processor, respectively. Accordingly, the transistors $T1 \sim T3$ and T4 function as a current switch circuit which judges the level of the input signals $i1 \sim i3$ and its logic threshold level is set to the reference potential Vr1 described above.

The power supply voltage of the circuit is set to a negative power supply voltage such as $-5.2V$, and the input signals $i1 \sim i3$ are the ECL level signals having a signal amplitude of 0.8V, for example. The reference potential V11 is set to a substantially intermediate level between the high and low levels of the input signals $i1 \sim i3$.

The collectors of the transistors $T1 \sim T3$ that are connected commonly are coupled further to the base of the transistor T5. The collector of this transistor T5 is connected to the ground potential of the circuit and a load resistor RE is interposed between its emitter and the power source voltage of the circuit. Accordingly, the transistor T5 forms an output emitter follower circuit in cooperation with the load resistor RE. The emitter voltage of the transistor T5 is the output signal OC of each gate cell.

When the corresponding gate cell is brought into the wired-OR form, the load resistor RE is disposed selectively on only one gate cell among the plurality of gate cells having the wired-OR form. At this time the load resistor RE functions as a terminal resistor RE in the gate cell in which the load resistor RE is disposed. In the other gate cells not equipped with the load resistor RE, the transistor T5 functions as an open-emitter type output transistor.

When any one of the input signals i1~i3 is at the high level of the ECL level higher than the reference potential Vr1, the corresponding transistors T1~T3 are turned ON while the transistor T4 is cut off. Accordingly, the voltage of the commonly connected collectors of the transistors T1~T3 is at a predetermined low level that is determined by the value of an operation current supplied from the constant current source S1 and by the value of the load resistor RE. Therefore, the emitter voltage of the transistor T5, that is, the output signal O of the gate cell, is at the low level of the ECL level which is lower by the base-emitter voltage of the transistor T5 than the voltage of the commonly connected collectors of the transistors T1~T3.

On the other hand, when the input signal i1~i3 are all at the low level of the ECL level lower than the reference potential Vr1, all the transistors T1~T3 are cut off while the transistor T4 is ON so that the voltage of the commonly connected collectors of the transistors T1~T3 is at the high level such as the ground potential of the circuit. The output signal OC of the gate cell is at the high level of the ECL level which is lower by the base-emitter voltage of the transistor T5 than the voltage of the commonly connected collectors of the transistors T1~T3.

In FIG. 2, the load resistor RE of the output emitter follower circuit is not disposed on the gate cells G23 and G32 and their transistors T15 and T10 are the output transistors of the open-emitter type. The output terminals OUTa and OUTb of these gate cells G23, G32 are connected commonly to the output terminal OUTc of the gate cell G42 through the common combined wiring CL1. The load resistor RE is disposed or the gate cell G42. Accordingly, the gate cells G23, G32 and G42 have the wired-OR form with the load resistor RE of the gate cell G42 being the terminal resistor.

All the gate cells G16, G27 and G46 are equipped with the load resistor RE of their output emitter-follower circuit, and are therefore the ordinary logic gate circuit or the terminal logic gate circuit. The input terminals i1 of these gate cells are connected commonly through the common combined wiring CL2 and then to the common combined wiring CL1 at the branch node na. The common combined wiring CL2 is not disposed in the straight line form as the first common combined wiring CL1 is made, but is disposed in such a fashion that the distance between the input terminals i1 of the gate cells G16, G27 and G46 become the shortest.

When any one of the output signals Oa, Ob and Oc of the gate cells G23, G32 and G42 is at the high level of the ECL level, the level of the common combined wiring CL1 is at the high level of the ECL level. This high level is transmitted to the input terminals i1 of the gate cells G16, G27 and G46 through the common combined wiring CL2. On the other hand, when all of the output signals Oa, Ob and Oc of the gate cells G23, G32 and G42 are at the low level of the ECL level, the level of the common combined wiring CL1 is at the low level of the ECL level. This low level is transmitted to the input terminals i10, i13, etc., of the gate cells G16, G27 and G46 through the common combined wiring CL2.

In other words, when all the input signals of the gate cells G23, G32 and G42 are at the low level, the common combined wirings CL1 and CL2 are at the high level of the ECL level. When any one of all the input signals of the gate cells G23, G32 and G42 is at the high level, they attain the low level of the ECL level for the first time.

As described above, the common combined wiring CL1 in this embodiment is disposed in the form of a straight line extending from the branch node na, which is adjacent to the output terminal OUTa of the gate cell G23, to the starting point to the branch node nc in the proximity of the output terminal OUTc of the gate cell G42. At this time the wiring distance between the branch node na and the output terminal OUTa of the gate cell G23 and the wiring distance between the branch node nb and the gate cell G32 are reduced to such an extent that their wiring resistance can be neglected. On the other hand, the terminal resistor RE is disposed at one of the end of the common combined wiring CL1 or, in other words, on the side of the branch node nc while the common combined wiring CL2 to which the input terminals i10, i13, etc., of the gate cells G16, G27 and G46 are connected is disposed at the other end of the common combined wiring CL1, that is, on the side of the branch node na. Furthermore, when the common combined wiring CL1 and CL2 are at the high or low level of the ECL level, the current flowing into the input terminals i10, i13, etc., of the gate cells G16, G27 and G46 is only the base current of the corresponding transistors T16, T21, etc., and its value is so small that the distributed resistance can be neglected.

Accordingly, when the output signal Oa of the gate cell G23 is at the high level while the output signals Ob, Oc of the gate cells G32 and G42 are at the low level, for example, the sum of the load resistance RE of the gate cell G42 and the distributed resistance from the output terminal OUTa to the output terminal OUTc is the substantial terminal resistance of the wired-OR circuit as viewed from the commonly connected input terminals of the gate cells G16, G27 and G46 on the input side. Similarly, when the output signal Ob of the gate cell G32 is at the high level and the output signals Oa, Oc of the gate cells G23 and G42 are at the low level, for example, the sum of the load resistance RE and the distributed resistance from the output terminal OUTb to the output terminal OUTc is the substantial terminal resistance of the wired-OR circuit.

In other words, in the high speed digital processor of this embodiment, the substantial level drop of the input signal with respect to the gate cells G16, G27 and G46 on the input side does not occur, though a certain distributed resistance exists between the load resistor RE and the output terminal OUTa of the gate cell G23 or the output terminal OUTb of the gate cell G32, because the terminal resistor RE is disposed in the common combined wirings CL1 and CL2 in accordance with a predetermined condition.

When, for example, the high level output signal is generated at the output terminal Oa of the gate cell G23, the emitter current of the output transistor T15 which is ON flows to the terminal resistor RE through the output terminal Oa, the nodes na, nb, nc and the output terminal Oc. Though part of the emitter current is supplied to the gate cells G16, G27 and G46 on the input side, it is a base current of each input transistor T16, T21, etc., is extremely small and can be therefore neglected. Therefore, the voltage drop between the output terminal Oa of the gate cell G23 and the input terminals i10, i13 of the gate cells G27, G46 on the input side appears only between the output terminal Oa and the node na. Here, the wiring length between the output terminal Oa and the node na is reduced to a negligible level. Therefore, the high level of the output signal Oa at the output terminal OUTa is equal substantially to the high level of the input signal of the input terminal i10 or i13.

Next, let's consider the case where the output transistor T15 of the gate cell G23 is OFF while the output transistor T10 of the gate cell G32 is OFF. The emitter current of the output transistor T10 which is ON flows to the terminal resistor RE through the output terminal Ob, the nodes nb, nc and the output terminal Oc. Though part of the emitter current is supplied to the gate cells G16, G27 and G46 on the input side, it is the base current of each input transistor T16, T21, etc. is extremely small and can be neglected. Accordingly, the voltage drop between the output terminal Ob of the gate cell G32 and the input terminals i10, i13 of the gate cells G27, G46 on the input side appears only between the output terminal Ob and the node nb. Here, the wiring length between the output terminal Ob and the node nb is reduced to such a level that the voltage drop can be neglected. Therefore, the high level of the output signal Ob at the output terminal OUTb is equal substantially to the high level of the input signal of the input terminal i10 or i13.

Furthermore, when both the output transistors T15 and T10 of the gate cells G23 and G32 are OFF while the output transistor T5 of the gate cell G42 is ON, the emitter current flows as such to the terminal resistor without passing through the wiring CL1. Therefore, the high level of the output signal Oc at the output terminal OUTc is equal substantially to the high level of the input signal at the input terminal i10 or i13.

It can be understood from the description given above that the high level output signal generated by the gate cell G23, G32 or G42 on the output side is transmitted to the gate cell G16, G27 or G46 without being affected by the voltage drop occurring in the wiring CL1.

As described above, the high speed digital processor of this embodiment three gate cells G23, G32 and G42 whose output terminals are connected commonly to form the wired-OR and the three gate cells G23, G32 and G42 for receiving the level of the commonly connected output terminal of these gate cells. The output terminals of the gate cells G16, G32 and G42 are connected by the first common combined wiring CL1 disposed in the straight line form in such a manner that the output terminal of each gate cell and the corresponding branch node are in the proximity to each other, and the terminal resistor R3 is interposed between one of its ends, that is, the branch node nc, and the power source voltage of the circuit. The input terminals of the gate cells G16, G27 and G46 are connected through the second common combined wiring CL2 and then connected to the branch node na, that is, the other end of the common combined wiring CL1. As a result, the distributed resistor existing between the output terminal of the gate cell on the current supply side and the branch node nc can be included in the substantial terminal resistance as viewed from the gate cells G16, G27 and G46 on the input side. For this reason, the level of the input signal to the gate cells G16, G27 and G46 on the input side is not lowered by the distributed resistance. In other words, the limitation imposed on the layout of the logic gate circuit having the wired-OR form and of the combined wirings can be mitigated so long as the layout method described above is employed. Accordingly, layout freedom of a high speed digital processor or the like containing a plurality of logic gate circuits of the wired-OR form can be expanded and its layout design can be made efficient.

Figure 3:
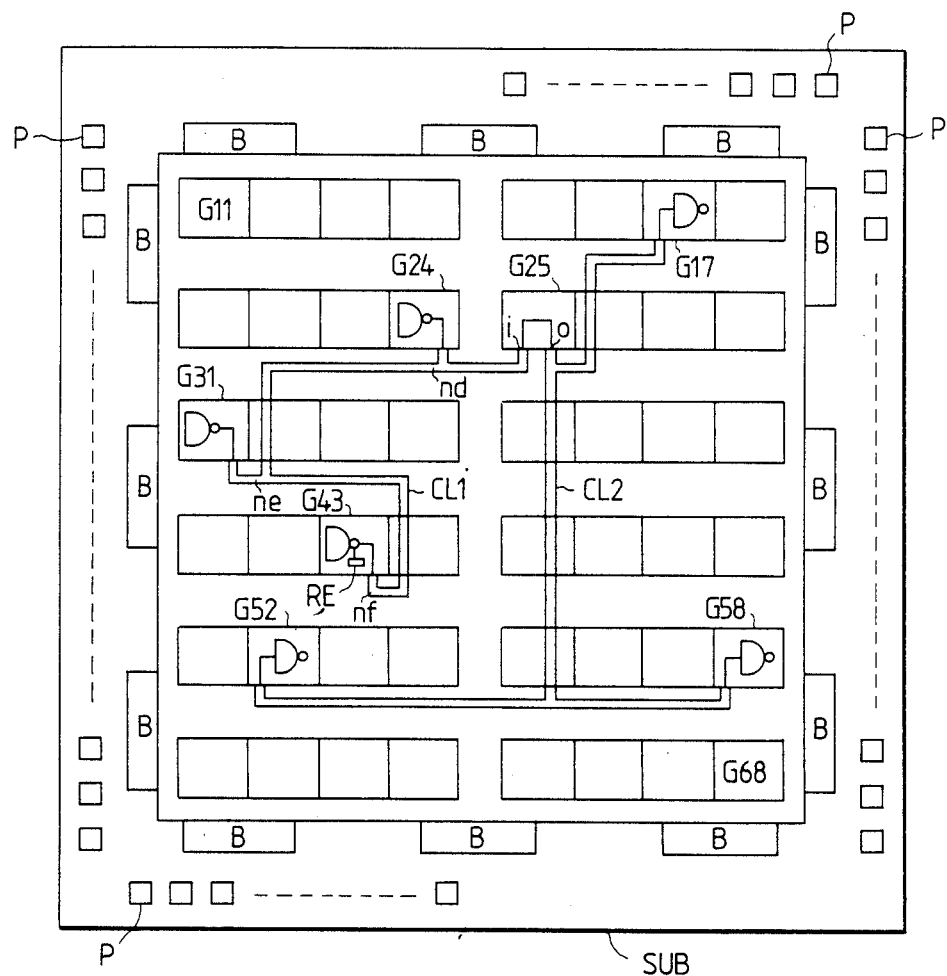
FIG. 3 is an arrangement diagram showing another embodiment of the high speed digital processor to which the present invention is applied.
Figure 4:
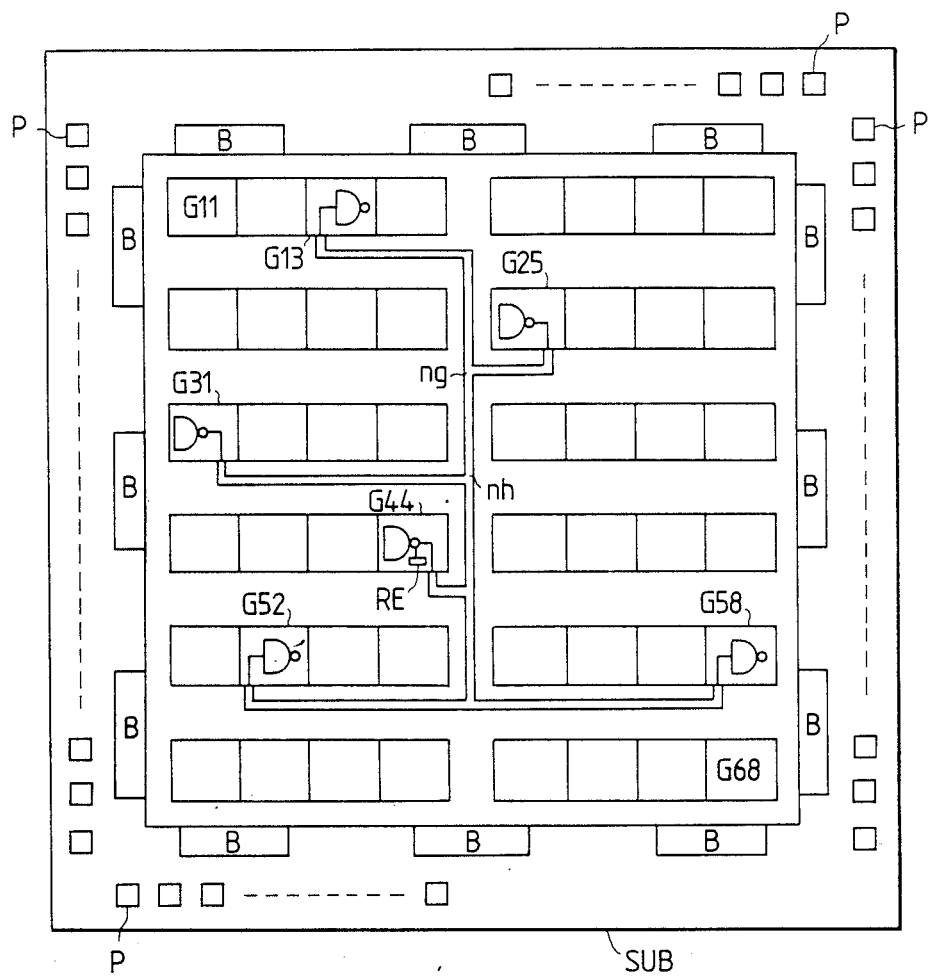
FIG. 4 is an arrangement diagram showing an example of a conventional high speed digital processor.

FIG. 3 is an arrangement diagram of another embodiment of the high speed digital processor to which the present invention is applied. The high speed digital processor in this embodiment is constituted on the basis of the same gate array integrated circuit of the high speed digital processor shown in FIG. 1. Therefore, the semiconductor substrate SUB, the gate cells G11~G18 and G61~G68, the buffer cell B and the bonding pad P shown in FIG. 3 correspond to the semiconductor substrate SUB, the gate cells G11~G18 and G61~G68, the buffer cell B and the bonding pad P of FIG. 1, respectively. Hereinafter the explanation will be added to the difference from the embodiment shown in FIG. 1.

In FIG. 3, the high speed digital processor includes the three gate cells G24, G31 and G43 the first logic gate circuit group) having the wired-OR form whose output terminals are connected commonly, and the three gate cells G17, G52 and G58 whose input terminals are connected to the commonly connected output terminal of the gate cells described above. These logic gate circuits have fundamentally the same construction as described already and its output is brought selectively into the open-emitter form when the load resistor forming the output emitter-follower circuit is selectively omitted.

In this embodiment the gate cells G24, G31 and G43 forming the first logic gate circuit group are disposed on the left side of the semiconductor substrate SUB relatively close to one another. The output terminals of the these gate cells are connected commonly by the first common combined wiring CL1 disposed in the straight line form from the output terminal of the gate cell G24, that is, the branch node nd to the output terminal of the gate cell G42, that is, the branch node ne, and further to the output terminal of the gate cell G43, that is, the branch node nf. A load resistor RE disposed in the output emitter-follower circuit of the gate cell 43 is disposed at one of the ends of the first common combined wiring CL1, that is, at the branch node nf, as the terminal resistor RE constituting the wired-OR circuit. The other end of the common combined wiring CL1, that is, the branch node nd, is connected to the input terminal i of the dummy cell disposed as the gate cill G25.

On the other hand, the gate cells G16, G27 and G46 forming the second logic gate circuit group are dispersedly disposed at arbitrary positions of the semiconductor substrate SUB and the input terminals of these gate cells are connected commonly through the second common combined wiring CL2 and then to the output terminal o of the dummy cell.

Here, the input and output terminals i and o of the gate cell G25, that is, the dummy cell, are connected to each other inside the cell and short-circuited. The dummy cell does not contain any members other than these input and output terminals i, o and the wiring for short-circuiting.

By the virtue of the same action as that of the embodiment shown in FIG. 1, the high speed digital processor of this embodiment can mitigate the limitation imposed on the layout of the logic gate circuit having the wired-OR form. As a result, layout freedom of the high speed digital processor containing the logic gate circuit having the wired-OR form can be expanded and its layout design can be made efficient.

On the other hand, in the high speed digital processor of this embodiment, layout of the circuit devices such as the gate cells and each combined wiring can be designed automatically and efficiently by the DA technique using a computer. At this time the wiring data of the common combined wiring CL1, that is, the wiring data of the output terminals of the gate cells G24, G31, G43 forming the first logic gate circuit group and the wiring data of the input terminal of the gate cell G25, that is, the dummy cell, as well as the wiring data of the common combined wiring CL2, that is, the wiring data of the input terminals of the gate cells G17, G52, G58 forming the second logic gate circuit group and the wiring data of the output terminal o of the dummy cell, are applied separately to the computer. The common combined wiring CL1 is disposed in the straight line form so that the output terminal of each gate cell and the corresponding branch node are adjacent to one another, the terminal resistor RE is disposed at one of its ends and its other end is connected to the input terminal i of the dummy cell, thereby mitigating the wiring condition. As a result, the computer can deal individually with the layout design of the common combined wiring CL1 and that of the common combined wiring CL2 in the same way as in the ordinary wiring layout, although a plurality of gate cells forming the first logic gate circuit group and a plurality of gate cells forming the second logic circuit group are arranged in mixture. Accordingly, the layout design of the high speed digital processor can be made further efficient.

As described above, in the high speed digital processor of this embodiment, the output terminals of a plurality of gate cells forming the first logic gate circuit group are connected commonly through the common combined wiring CL1 disposed in the straight line form while the input terminals of a plurality of gate cells forming the second logic gate circuit group are connected through the common combined wiring CL2. These common combined wirings CL1 and CL2 are connected through the dummy cell. Therefore, the high speed digital processor of this embodiment can mitigate the limitation imposed on the layout of the logic gate circuit having the wired-OR form by the same action as that of the embodiment shown in FIG. 1 and can make its layout design efficient. Since the dummy cell splitting the common combined wirings CL1 and CL2 is disposed, automatic design by the computer can be standardized more easily although the gate cells forming the first logic gate circuit group and the gate cells forming the second logic gate circuit group are disposed in mixture, and the layout design of the high speed digital processor can be made further efficient.

As can be understood from the two embodiments given above, the present invention provides the following action and effect when applied to the high speed digital processor including a plurality of logic gate circuit having the wired-OR form.

(1) In the high speed digital processor or the like containing a plurality of logic gate circuits having the wired-OR form, the first common combined wiring coupling the output terminals of the logic gate circuits on the output side is disposed (e.g., in a straight line form), in such a manner that the branch node corresponding to the output terminal of each logic gate circuit is in the proximity of the others, the terminal resistor is disposed between one of the end of this first common combined wiring and the power source voltage or ground potential of the circuit and the other end is connected to the second common combined wiring connecting the input terminals of the logic gate circuits on the input side. In this manner the distributed resistance existing in the first common combined wiring can be contained in the substantial terminal resistance as viewed from the logic gate circuits on the input side. For this reason, the limitation imposed on the layout of the wired-OR form and the combined wirings of the logic gate circuits can be mitigated.

(2) Due to the effect (1), layout freedom of the high speed digital processor or the like containing a plurality of logic gate circuits having the wired-OR form can be expanded.

(3) Due to the effects (1) and (2) described above, the layout design of the high speed digital processor or the like containing a plurality of logic gate circuits having the wired-OR form can be made efficient.

(4) Due to the effects (1), (2) and (3) described above, the first and second common combined wirings are connected through the dummy cell having two terminals connected to each other inside the dummy cell so that the layout design of the high speed digital processor or the like can be made further efficient by use of the DA technique using a computer.

Figure 5:
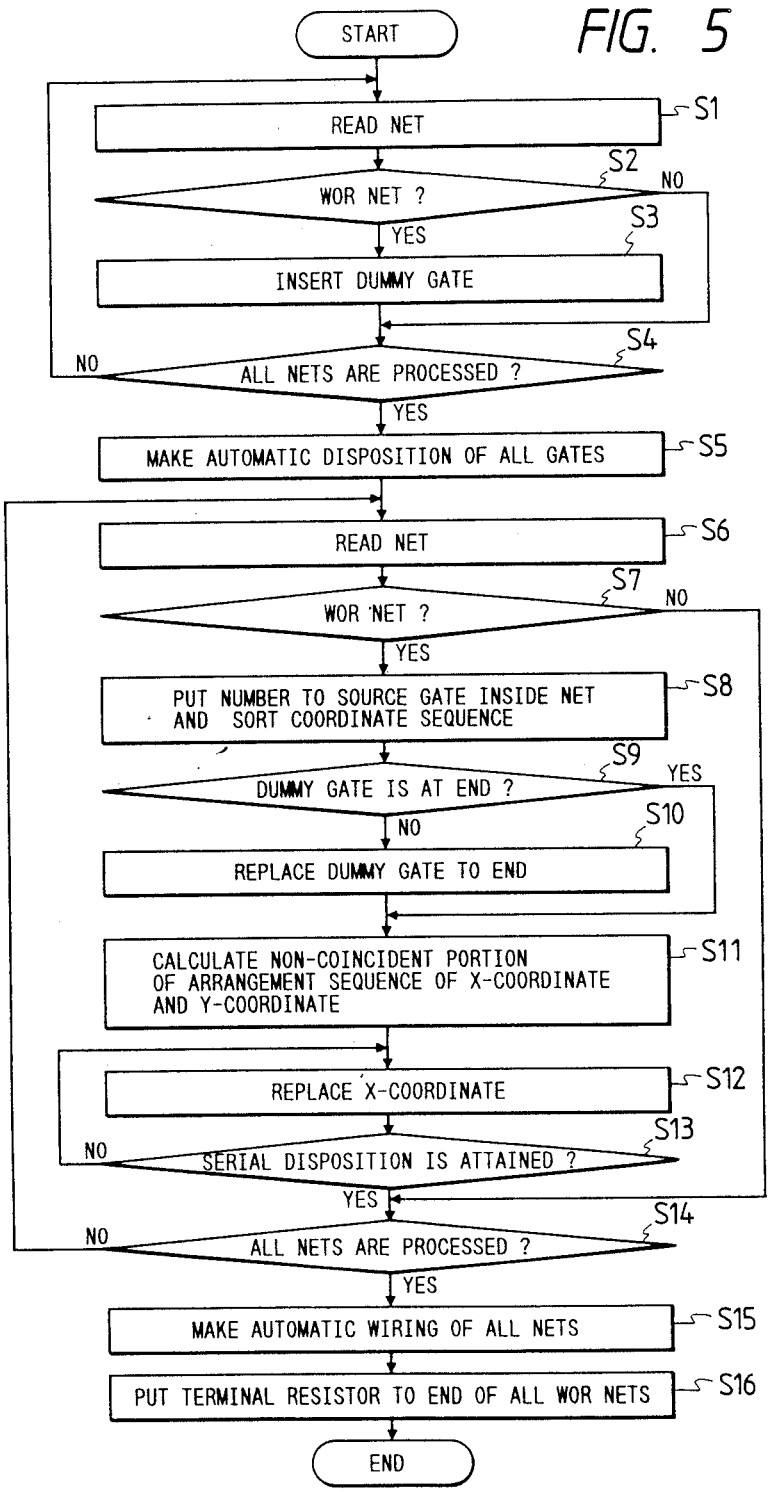
FIG. 5 is a flowchart showing an embodiment of the present invention.
Figure 6:
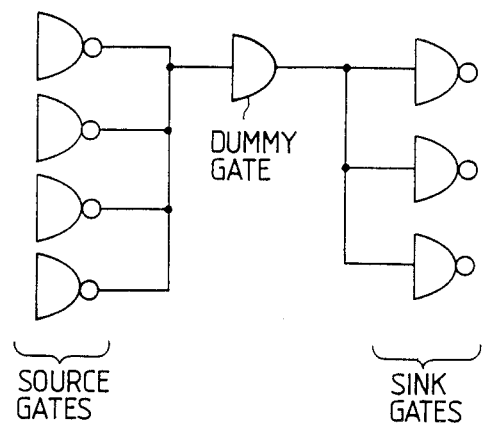
FIG. 6 is an explanatory view of the step S3 of FIG. 5.

Next, a method of arranging and wiring automatically the net forming the wired-OR (WOR net) in such a manner as to minimize the voltage drop due to the wiring resistance will be explained in detail with reference to the flowchart of FIG. 5.

The following three methods are known as the method of accomplishing the present invention by a DA program.

(1) An automatic placement method with the insertion of the dummy cell.
(2) An automatic placement method without the insertion of the dummy cell.
(3) An automatic placement method which is not particularly concerned with the presence or absence of the dummy cell.

The following description will explain the case (1). The method (2) can be practised by the minor change of the method (1) but involves the demerit of the drop of wirability or in other words, the increase in the total wiring length at the time of wiring due to the increasing number of limitations on the placement. Though the method (3) does not reduce freedom of the placement but involves the problems that the wiring method (algorithm) is limited to a maze router, a line serach router, etc., and the wiring length of the WOR net becomes great in some cases.

The information of each net is inputted (step S1) and the WOR net (a plurality of source gates exist) is extracted (steps S2 and S4). A dummy gate is inserted between the source gate and the sink gate (step 3). All the gates (cells) inclusive of the dummy gate are arranged automatically (step S5). The placement is made by an ordinary placement method without considering WOR (Wired-OR) in particular (step S5). For example, the initial placement is made by clustering and minicut and the improvement of placement is made by a two-dimensional pair-wise method. The total wiring length, local wiring congestion and a path delay value are used as the evaluation values for the improvement. (See IEEE Proceedings of the 23rd Design Automation Conference, June 29–Jul. 2, 1986, pp. 404–410, "Efficient Placement Algorithms Optimizing Delay for High-Speed ECL Masterslice LSIS").

Figure 7:
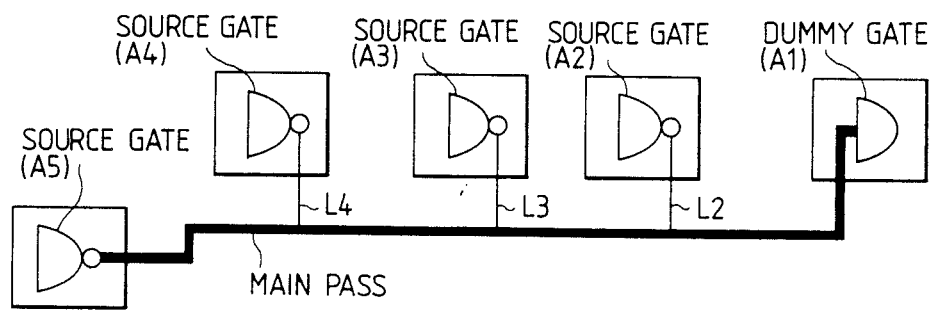
FIG. 7 is an explanatory view of the step S5 of FIG. 5.

Next, the improvement of the placement of each source gate is made so that the wiring connecting the output terminal of the source gate (cell) becomes serial. The term "serial" hereby means the wiring form which makes the length of each wiring L2, L3, L4 from the main pass to each source gate is below a predetermined length as shown in FIG. 7. The wiring length of each connection wiring is set so that it is below the limit value of a predetermined voltage drop. Since the wiring length and the resistance value are proportion to each other, the wiring length of each connection wire can be determined easily.

Figure 8:
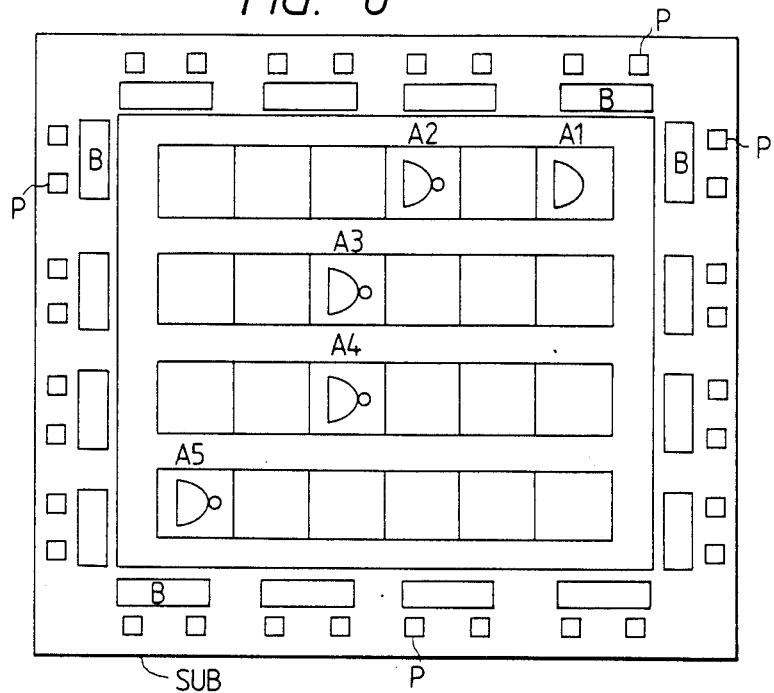
FIG. 8 is an explanatory view of the serial arrangement of the step S13 of FIG. 5.

The improvement of placement employed in this embodiment in order to make the wiring serial represents the placement which satisfies the following condition. In other words, the result of placement of the source gates A2~A5 is rightwardly upward (or rightwardly downward) and the dummy gate A1 is disposed at the upper end (or the lower end) as shown in FIG. 8. Since there is no need that the gates must be disposed in the proximity of one another, freedom of placement is by higher than the conventional placement method.

It will be assumed in FIG. 8 that the mounting coordinates of the cell A1 are (X1, Y1), the coordinates of A2 are (X2, Y2) and those of A3, A4 and A5 are (X3, Y3), (X4, Y4) and (X5, Y5), respectively. In this instance the placement state is such that numbering can be made such as $X1 \geq X2 \geq X3 \geq X4 \geq X5$ and $Y1 \geq Y2 \geq Y3 \geq Y4 \geq Y5$ (or $X1 \geq X2 \geq X3 \geq X4 \geq X5$ and $Y1 \leq Y2 \leq Y3 \leq Y4 \leq Y5$). In FIG. 8, the A1 is the dummy gate, but the gate A5 can be the dummy gate.

Next, a definite method of attaining the rightwardly upward or downward placement will be explained with reference to steps S8 to S13 of FIG. 5.

Figure 9:
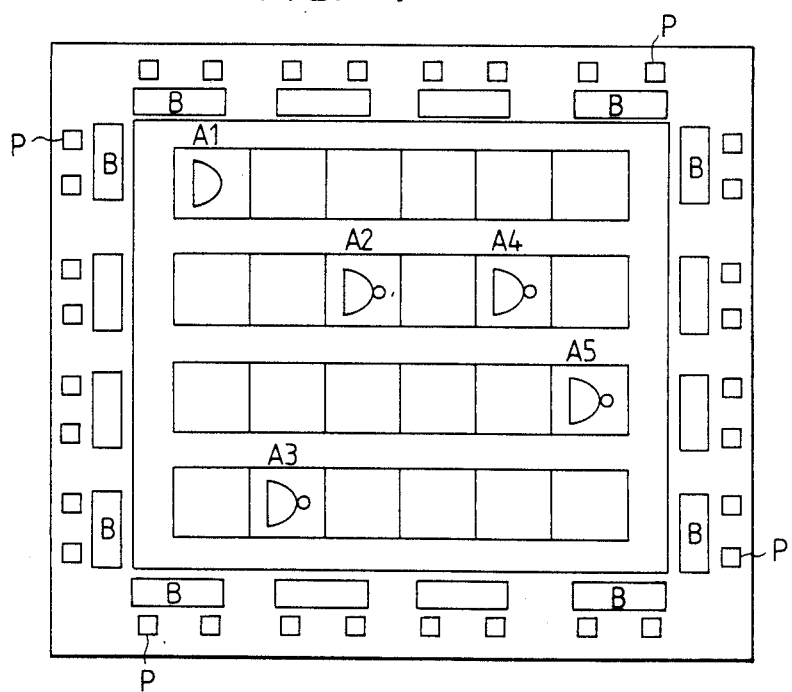
FIGS. 9 and 10 are explanatory views of the steps S11 and S12 of FIG. 5.

First of all, it will be assumed in FIG. 9 that the mounting coordinates of A1, A2, A3, A4 and A5 are (X1, Y1), (X2, Y2), (X3, Y3), (X4, Y4) and (X5, Y5), respectively. Next, the X and Y coordinates are aligned in the ascending sequence of the coordinates for each gate (sorting):

$X1 < X3 < X2 < X4 < X5$ $Y3 < Y5 < Y4 = Y2 < Y1$

In this case, since Y4=Y2, the sequence of the X coordinates is also considered. Then, since X2 is on the left side of X4, the sequence of the Y coordinates is also changed to obtain the following:

$X1 < X3 < X2 < X4 < X5$ $Y3 < Y5 < Y2 = Y4 < Y1$ (step S8)

Next, whether or not the dummy gate is at the end of the alignment of the Y coordinates, that is whether or not it is in agreement with Y1 or Y3, is examined. In the case of FIG. 9, since Y1 is the dummy gate, the step S9 is finished as such. If it is not in agreement, the position of replacement by the cell at the end is made (step 10).

Next, whether or not the sequence of the X coordinates is the same as or opposite to the sequence of the Y coordinates is examined between one gate and the other (step S11).

To this end, the sequence of the X coordinates for all the combinations of the row sequence of the Y coordinates is given as follows:

| | |
|---|---|
| (A1, A3) | - opposite sequence |
| (A1, A2) | - opposite sequence |
| (A1, A4) | - opposite sequence |
| (A1, A5) | - opposite sequence |
| (A3, A2) | - normal sequence |
| (A3, A4) | - normal sequence |
| (A3, A5) | - normal sequence |
| (A2, A4) | - normal sequence |
| (A2, A5) | - opposite sequence |
| (A4, A5) | - opposite sequence |

In accordance with this result, re-arrangement of cells is made to attain the rightwardly downward serial placement, that is, the placement wherein the X coordinates and the Y coordinates are arranged in the opposite order, because the normal sequence is 4 and the opposite sequence is 6, in order thereby to reduce the number of subsequent operations. Since the X coordinates of A2, A4, A5 and the X coordinates of A3 are opposite to those of the others, A3 is moved on the right side of A2, A4 and A5.

Figure 10:
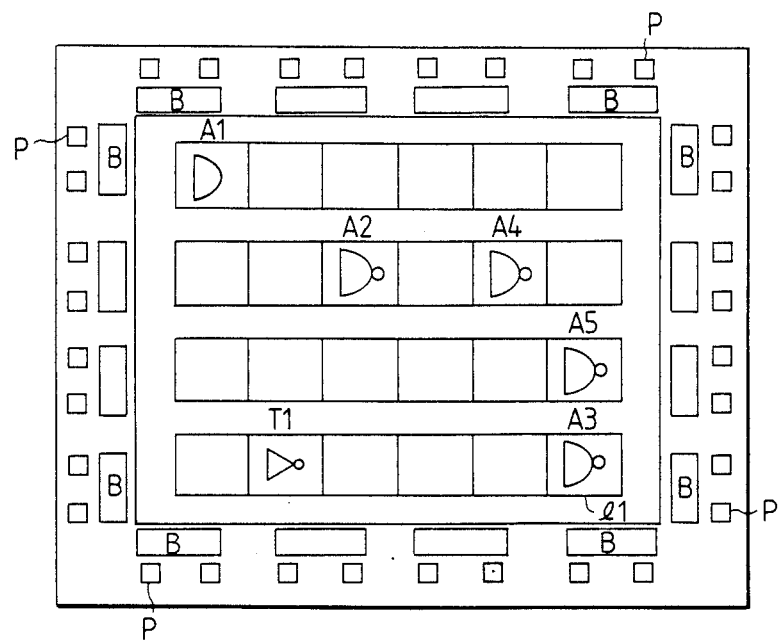

Due to the movement of the X coordinates, the re-arrangement with the other gate T1 which exists in the same cell row and at the position which satisfies the condition described above, that is, at the position 11 in FIG. 10, is made (step S12).

The re-arrangement is made by the ordinary placement improving method referred to as the "pair-wise method". Though only T1 is shown by way of example, the method which makes the total wiring length shorter after re-arrangement is selected when a plurality of applicants exist.

As a result of the re-arrangement described above, $$\left. \begin{array}{l} X1 < X2 < X4 < X5 = X3 \\ Y3 < Y5 < Y2 = Y4 < Y1 \end{array} \right\} \quad (*1)$$

In this formula, since the sequence of X2 and X3 is opposite, the re-arrangement is to be made. However, since Y2=Y4, the sequence of the Y coordinates is re-arranged without moving the cells. In other words, the following can be obtained.

$$\left. \begin{array}{l} X1 < X2 < X4 < X5 = X3 \\ Y3 < Y5 < Y4 = Y2 = < Y1 \end{array} \right\} \quad (*2)$$

The operations described above are carried out for all the WOR nets and the serial placement is completed (steps S6~S14).

Figure 11:
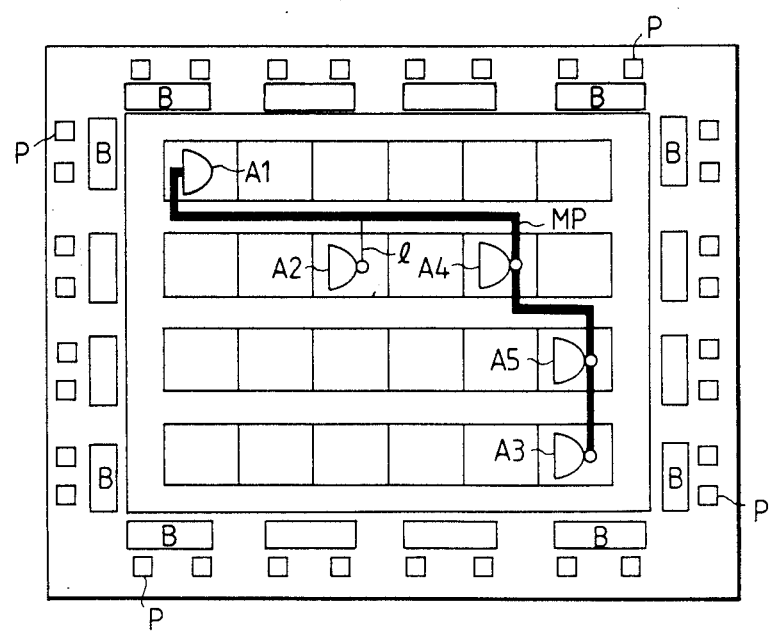
FIG. 11 is an explanatory view of the step S15 of FIG. 5.

Next, the route of the main pass wiring MP and the connection wiring 1 for the gates arranged in the serial placement is determined as shown in FIG. 11 (step S15).

Any specific contrivances are not required, in particular, for the WOR net so long as the wiring method is the one that shortens the wiring length such as a channel router, a maze router or a line search router that is employed ordinarily.

When the dummy gate does not exist, placement is made in such a manner that the group of the source gates and the group Z of the sink gates are separated as shown in the drawing.

Placement is made so that:

the MAX value of the X coordinates of the source gates is smaller than the MIN value of the X coordinates of the sink gates, and the MAX value of the Y coordinates of the source gates is smaller than the MIN value of the Y coordinates of the sink gate in the case of the rightwardly upward placement.

In the case of the rightwardly downward placement, on the other hand, placement is made so that:

the MIN value of the X coordinates of the source gates is greater than the MAX value of the X coordinates of the sink gates and the MIN value of the Y coordinates of the source gates is greater than the MAX value of the Y coordinate of the sink gates.

Figure 12:
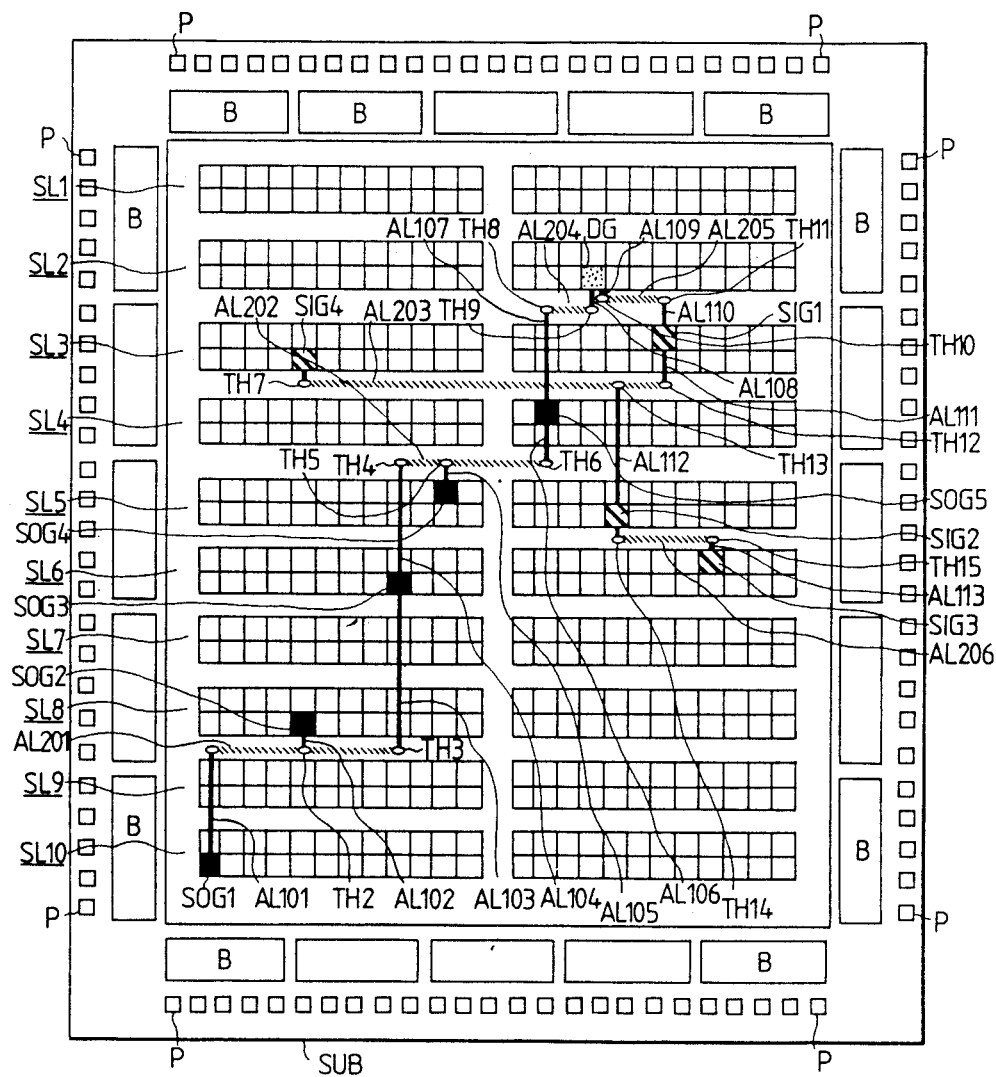
FIG. 12 is an arrangement diagram showing another embodiment of the digital processor constituted on the basis of the flowchart of FIG. 5.

FIG. 12 shows an example when the present invention is applied to a gate array containing a plurality of cell rows SL1~SL10. The source gates SOG1~SOG5 and the dummy gate DG are shown arranged in the rightwardly upward placement. The placement of the sink gates SIG1~SIG4 is not particularly limitative. The terminal resistor is disposed at the source gate SOG1. Each gate is coupled by an aluminum wiring. This embodiment uses a two-alyered wiring technique and the first layer aluminum wiring and the second layer aluminum wiring are coupled by a through-hole formed in a vertical direction. In this embodiment the direction of the first layer aluminum wirings AL101~AL103 crosses at right angles the direction of the second layer aluminum wirings AL201~AL206.

Although the invention made by the present inventor has thus been described definitely with reference to its preferred forms, it is not particularly limited thereto, but can of course be changed or modified in various manners without departing from the gist thereof. For example, in the embodiments shown in FIGS. 1 and 3, though the common combined wiring CL1 is disposed in the straight line form at the position in the proximity of the output terminals of the gate cells on the output side, the distance between the output terminal of each gate cell and the branch node corresponding thereto can be increased within the allowable range of the distributed resistance value between them. In other words, in the foregoing embodiments, the gate cells constituting the first logic gate circuit group are arranged relatively close to one another but they may be disposed substantially dispersedly on the semiconductor substrate SUB provided that the common combined wiring CL1 is disposed in the straight line form between the output terminals of the gate cells, the terminal resistor is disposed at one of its end and its other end is connected to the second common combined wiring. In each of the embodiments described above, the terminal resistor RE need not always be contained in the logic gate circuit and each gate cell has a mutually different circuit structure. In FIG. 2, the gate cell may consist of a 2-input or 4-input logic gate circuit as its basic structure and may have both the inversion and non-inversion output terminals. In FIG. 3, the gate cell G25 as the dummy cell has two or more sets of input and output terminals connected commonly inside the cell or may contain an ordinary logic gate circuit. Furthermore, various forms and methods may be employed for the definite layout of the high speed digital processor shown in FIGS. 1 and 3, the connection method of the gate cells and the definite circuit construction of the gate cells shown in FIG. 2.

Although the present invention made by the present inventor has been described primarily with reference to the application thereof to the high speed digital processor consisting of the bipolar gate array integrated circuit as the background and field of utilization of the invention, the present invention is not particularly limited thereto but can also be applied to high speed digital processors consisting of exclusive integrated circuits and various other digital units and apparatus consisting of bipolar gate array integrated circuit. The present invention can be widely applied to semiconductor integrated circuit apparatuses containing at least a plurality of logic gate circuit arranged in the wired-OR form.

What is claimed is:

1. A semiconductor integrated circuit device comprising:
    a first logic gate cell group;
    a first common wiring for connecting an output terminal of each logic gate cell in said first logic gate cell group in order to connect said output terminals with one another, wherein said first common wiring has a first end and a second end, and wherein said output terminals of each of said logic gate cells in said first logic gate cell are coupled to said first common wiring between said first and said second ends;
    a terminal resistor disposed inside a logic gate cell connected to the first end of said first common wiring, for setting the output level used commonly for said logic gate cells in said first logic gate cell group;
    a second logic gate cell group; and
    a second common wiring coupled to said second end of said first common wiring for connecting an input terminal of each of said logic gate cells in said second logic gate cell group to the second end of said first common wiring.

2. A semiconductor integrated circuit device according to claim 1, wherein each of said logic gate cells includes an emitter coupled logic circuit and an emitter output transistor whose emitter is connected to the output terminal of said logic gate cell.

3. A semiconductor integrated circuit device according to claim 2, wherein said terminal resistor is connected as an emitter resistor to said emitter output transistor of said logic gate cell connected to the first end of said first common wiring among said logic gate cells of said first logic gate cell group, and said emitter output transistors of the other of said logic gate cells are of an open emitter type.

4. A semiconductor integrated circuit device according to claim 3, wherein said semiconductor integrated circuit device is a gate array integrated circuit device and said first and second common wirings are coupled to each other through a logic gate cell connected between said first logic gate cell group and said second logic gate cell group.

* * * * *